United States Patent [19]

Arndt, Jr. et al.

[11] 3,983,402
[45] Sept. 28, 1976

[54] ION IMPLANTATION APPARATUS

[75] Inventors: Herbert Lorenz Arndt, Jr.; Demetrios Balderes, both of Wappingers Falls; John Robert Kranik; Charles John Lucas, both of Poughkeepsie, all of N.Y.

[73] Assignee: International Business Machines Corporation, Armonk, N.Y.

[22] Filed: Dec. 22, 1975

[21] Appl. No.: 643,221

[52] U.S. Cl. ............................. 250/492 A; 250/441
[51] Int. Cl.² ........................................ G01M 23/00
[58] Field of Search .............. 250/441, 457, 492 A; 313/185

[56] References Cited
UNITED STATES PATENTS

| | | | |
|---|---|---|---|
| 2,220,973 | 11/1940 | Marton | 250/441 |
| 2,440,067 | 4/1948 | Benson | 250/441 |
| 2,627,580 | 2/1953 | Picard | 250/457 |
| 3,778,626 | 12/1973 | Robertson | 250/492 A |
| 3,857,041 | 12/1974 | Spicer | 250/492 A |

*Primary Examiner*—Alfred E. Smith
*Assistant Examiner*—Bruce Anderson
*Attorney, Agent, or Firm*—William J. Dick

[57] ABSTRACT

Disclosed is ion implantation apparatus in which an ion source is coupled to a semiconductor or workpiece holder which is mounted for rotation and reciprocation in a first chamber in the path of the ion beam. A second chamber is releasably coupled to the first chamber with means connected to the second chamber in such a manner as to enable displacement between the first and second chamber, the chambers being in fluid communication with one another when the apparatus is in operation. Vacuum drawing means are provided to effect a vacuum in both the first and second chamber when the apparatus is in operation, and when it is desired to withdraw the holder from the apparatus by disconnecting the second chamber from the first chamber, venting the first chamber automatically actuates a check valve which seals the second chamber permitting the retention of a vacuum in the second chamber while allowing the first chamber to be exposed to atmospheric pressure.

10 Claims, 5 Drawing Figures

ION IMPLANTATION APPARATUS

The purpose of this abstract is to enable the public and the Patent Office to determine rapidly the subject matter of the technical disclosure of the Application. This abstract is neither intended to define the invention of the Application nor is it intended to be limiting as to the scope thereof.

SUMMARY OF THE INVENTION AND STATE OF THE PRIOR ART

The present invention relates to ion implantation apparatus and more particularly relates to ion implantation apparatus in which the workpieces to be implanted are mounted for both rotation and reciprocation to insure uniformity of dose, the apparatus to effect such reciprocation and rotation being sealed from the vacuum in the ion implantation portion of the apparatus, and including means for retaining a vacuum in a portion of the system when it is desired to withdraw the workpieces from another part of the system.

In U.S. Pat. No. 3,778,626, issued on Dec. 11, 1973 to Robertson, a mechanical scan system for ion implantation is disclosed. Robertson recognizes that the maximum current in an ion beam is related to the length of the beam path and that the ion beam is spread by the effects of the space charge surrounding the constituent ions, and accordingly, it is desirable to maintain the beam path length as short as possible. Robertson also discusses the disadvantage of an X–Y system because of the need to reverse the motion of the scanning system at the ends of the line comprising the raster. Robertson proposes to both rotate the target with respect to a stationary ion beam and to traverse or reciprocate the workpiece with respect to the beam, thus eliminating the problems associated with both the beam deflection and X–Y type ion implantation system.

However, several system problems are not addressed by Robertson, for example, the retention of the semiconductor wafers or workpiece on the rotating scanning disc; the retention of a suitable vacuum in the first or work chamber in which the disc rotates while at the same time sealing the mechanism for effecting such rotation and reciprocation from the sub-atmospheric pressure existing in the work chamber so as to prevent lubricating oils and the like from contaminating the workpieces on the scanning disc.

The problem of inhibiting contamination of the workpiece being implanted with ions was resolved by providing a second chamber which housed a bellows or flexible wall member in which is located the mechanism for rotating and reciprocating the scanning disc (workpiece holder). However, the vacuum drawn in the work or first chamber and the vacuum drawn around the bellows or flexible wall member in the second chamber added problems to overall system operation and efficiency. For example, the use of a bellows with its attendant large surface area led to a problem, for upon removal of the workpiece holder from the system and the attendant breaking of the vacuum in the first or work chamber, the vacuum was also broken in the second chamber in which was housed the bellows. This meant that in bringing the system up for the next batch of workpieces or semiconductor wafers held by the work holder or scanning disc, it was necessary to once again evacuate the second chamber or the area surrounding the bellows. In and of itself, this required a longer pump down time reducing the throughput of the ion implantation apparatus. Attendant with the longer pump down time was the exposure of the bellows to atmospheric pressure and temperature during the time of loading and unloading the workpieces or semiconductor wafers from the work holder or scanning disc. This exposure caused formation of condensation due to the rapid changes in pressure on the exterior of the bellows. Because of the condensation, an even longer pump down time is necessary to achieve a sufficient sub-atmospheric pressure or vacuum in the chambers to effectively remove the condensation.

In view of the above, it is a principal object of the present invention to provide ion implantation apparatus in which the work chamber is effectively isolated from the chamber enclosing the apparatus which effects a scanning rotation and reciprocation of the work holder during exposure of the work holder for loading and unloading the same.

Another object of the present invention is to provide an ion implantation apparatus in which the chamber housing the mechanism for effecting movement of the workpiece holder is under the same sub-atmospheric pressure as the work or first chamber during operation of the apparatus, and when desired, may be maintained under that vacuum even though the pressure in the first chamber has been raised to at least atmospheric.

Yet another object of the present invention is to provide ion implantation apparatus in which a uniform sub-atmospheric pressure may be provided in both the work chamber and the chamber surrounding the apparatus used to effect both rotation and reciprocation of the scanning disc or work holder during ion implantation, but which automatically will seal the second chamber and prevent an increase in pressure in the second chamber upon "breaking" vacuum or raising the pressure in the first chamber.

Other objects and a more complete understanding of the invention may be had by referring to the following Specification and Claims taken in conjunction with the accompanying drawings in which;

Figure 2:
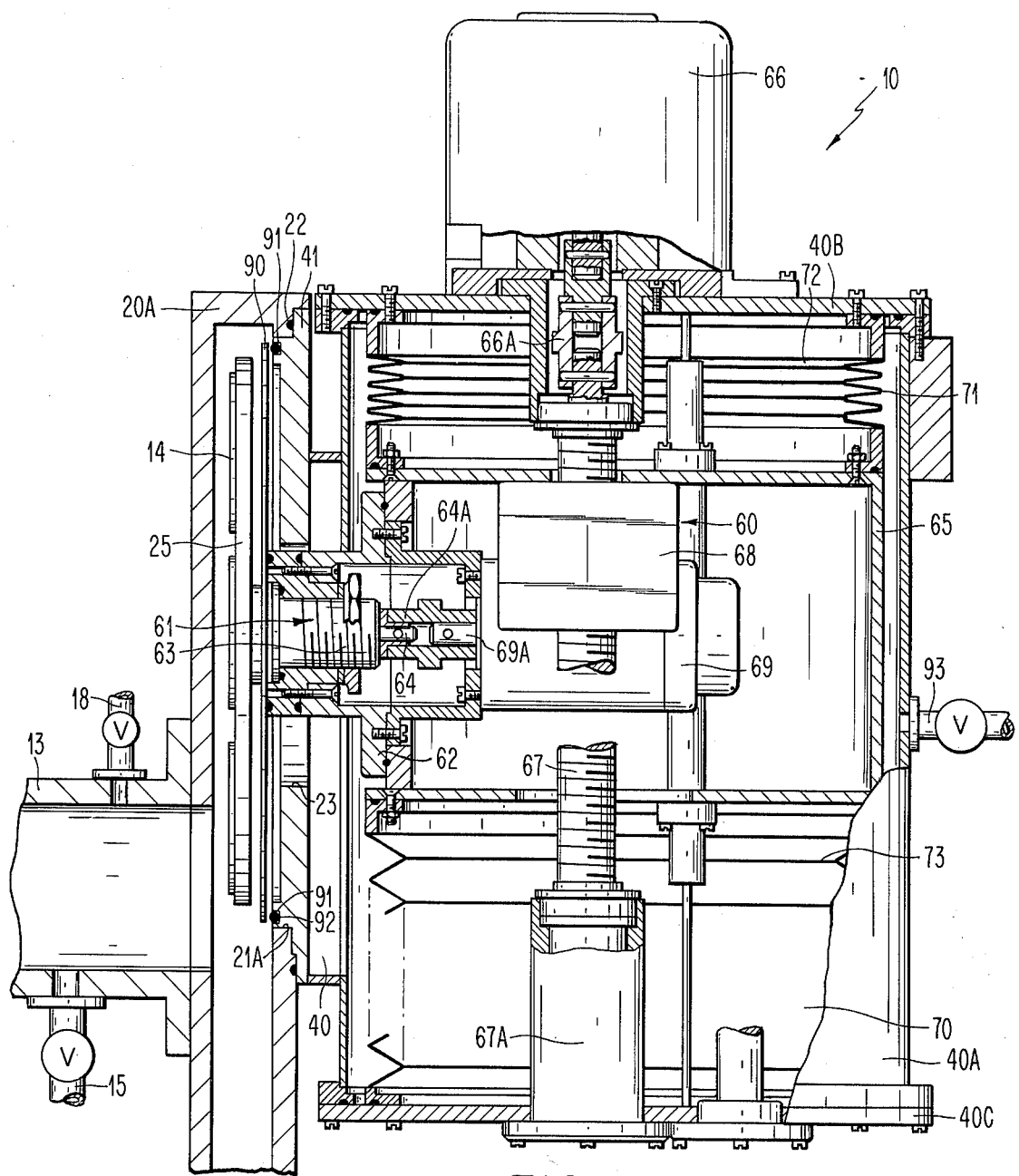
FIG. 2 is a fragmentary side elevational view of the apparatus illustrated in FIG. 1 but in greater detail.
Figure 2A:
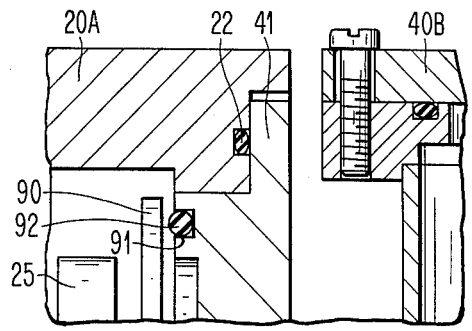
Figure 2B:
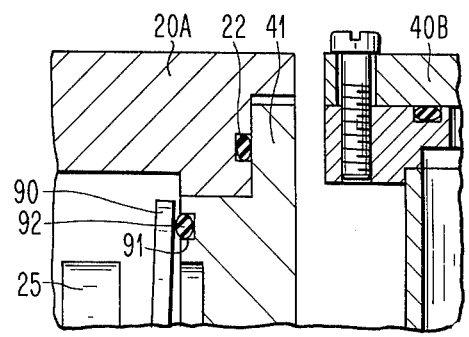

FIG. 2A is an enlarged fragmentary sectional view of a portion of the apparatus illustrated in FIG. 2 and showing that portion in a first position when the apparatus is in operation; and FIG. 2B is a fragmentary enlarged sectional view of the same apparatus illustrated in FIG. 2A but showing the apparatus in a second position just prior to removing the workpiece holder from the apparatus for loading and/or unloading of the workpieces from the workpiece holder.

Figure 1A:
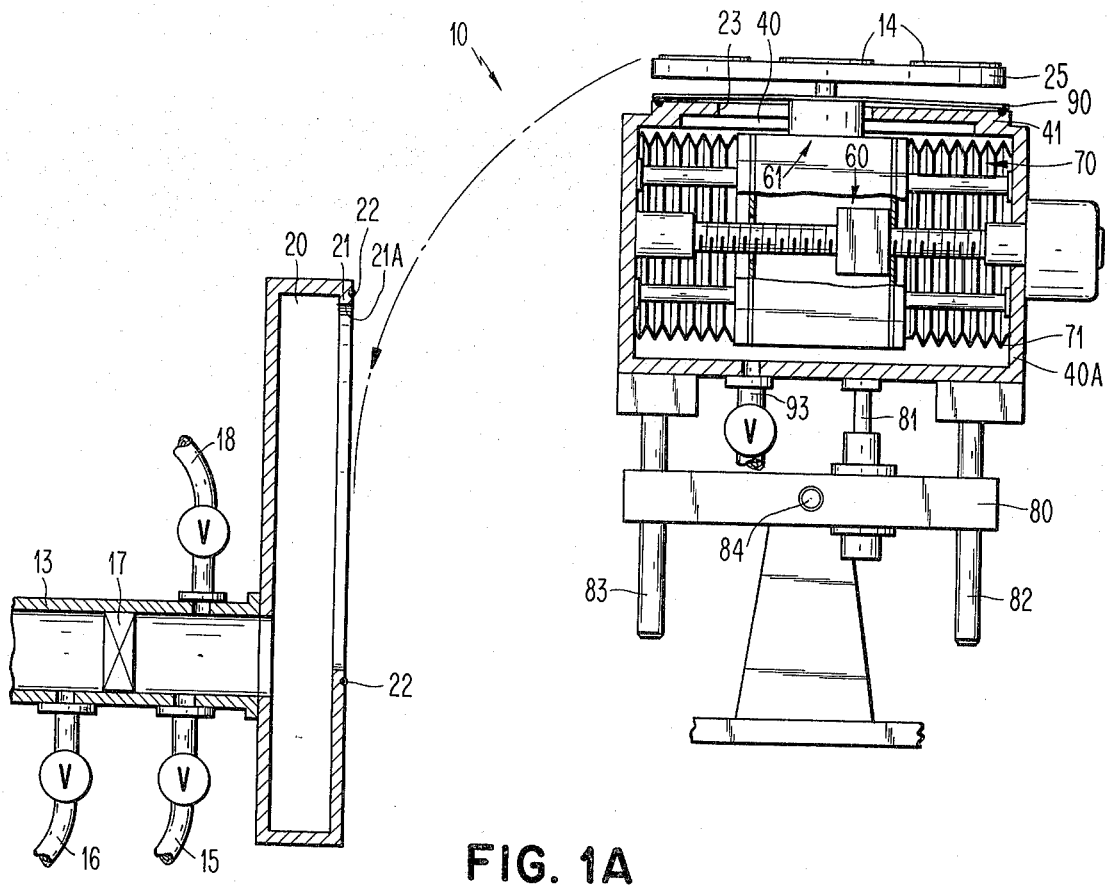
FIG. 1A is a simplified fragmentary schematic view of apparatus constructed in accordance with the present invention and illustrating a portion of the apparatus in a first position for receiving workpieces, and in FIG. 1B showing the apparatus in the second position closed and in operation.
Figure 1B:
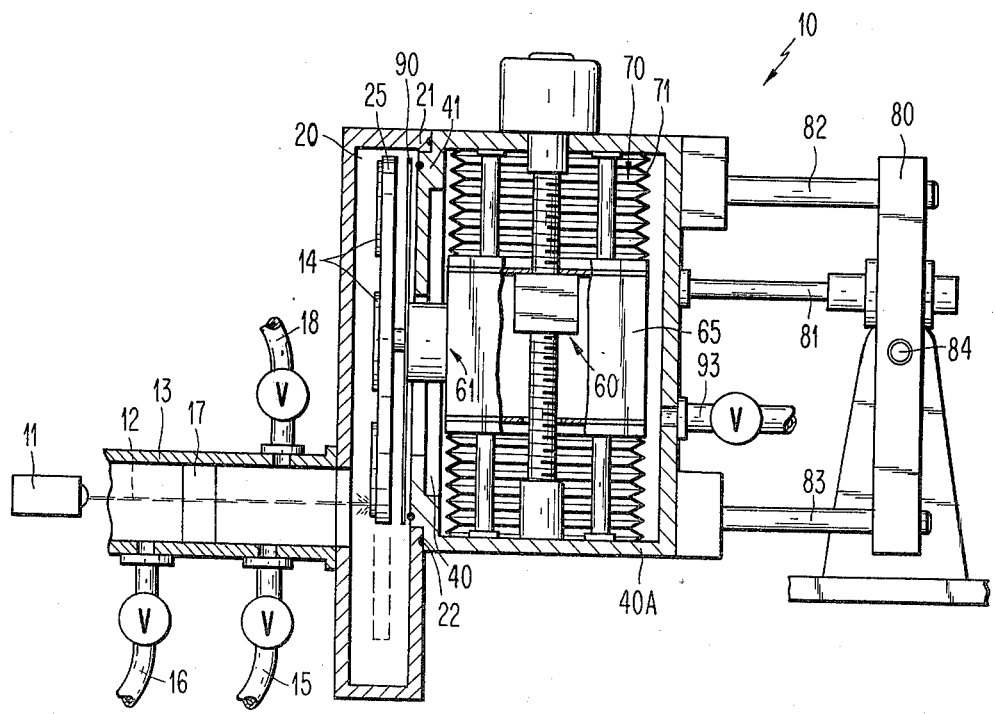

Referring now to the drawings, and especially FIGS. 1A and 1B thereof, apparatus 10, constructed in accordance with the present invention is illustrated therein. For a better understanding of the apparatus, a brief description of it and its operation will be described first relative to FIGS. 1A and 1B and then a more detailed description will follow relative to FIG. 2.

The apparatus 10 includes an ion source 11 which couple an ion beam 12 through suitable analyzing, accelerating and focusing apparatus (not shown) and a duct 13 into a first or work chamber 20 in which is mounted for rotation a scanner disc or work holder 25. Mounted in a second chamber 40, which is in fluid communication with the first chamber 20, is work holder drive means 60 which effects both rotation and reciprocation of the work holder so as to vary the location of the impinging ion beam 12 from the ion source 11 onto workpieces 14 mounted on the work holder 25. The drive means 60 forms part of a the third chamber 70 which is isolated from the second chamber as by a flexible wall 71, in the illustrated instance, a cylindrical bellows. Coacting and abutting wall means 21, 41 intermediate the first and second chambers mate with a seal 22, a large opening 23 in the wall 41 providing fluid communication between the first chamber 20 and the second chamber 40 and permitting interconnection between the drive means 60 and the work holder 25 as by shaft means 61.

In order to permit loading and unloading of the workpiece holder 25, means are provided to withdraw the workpiece holder from the first chamber 20. To this end, and as illustrated schematically in FIGS. 1A and 1B, chamber withdrawal and displacement means 80, coupled to the second chamber housing 40A, first serves to separate the first chamber 20 from the second chamber 40 as along shaft 81, and supported by supplemental guide shafts 82 and 83, and then serves to rotate, as about pivot 84, the housing 40A and thus the second chamber 40 into an upright position such as shown in FIG. 1A, exposing the semiconductor wafers or other workpieces 14 for withdrawal and subsequent loading.

When the first chamber is in confronting and abutting relationship with the second chamber and the apparatus is in operation, it is preferable that both the first and second chambers be subjected to sub-atmospheric pressure (e.g. a vacuum). The vacuum may be drawn through a rough vacuum line 15 which is separated from a high vacuum line 16 by a gate valve 17 to maintain the "upstream" portion of the duct 13 under a high vacuum even though the first and second chambers may be opened. After the rough vacuum has been drawn, then the gate valve 17 may be opened and the system stabilized so that both the first and second chambers are under a high vacuum.

However, when the implantation has been completed, and it is desired to withdraw the work holder 25 from the first chamber 20, as by the withdrawal means 80, it is necessary that the vacuum in at least the first chamber 20 be broken so as to permit withdrawal of the rotating work holder from the chamber. To this end, an air vent 18 may first be connected to a suitable nitrogen source to purge the system and pressurize the first chamber so as to permit such withdrawal.

Moreover, in order to reduce process time, and in accordance with the invention, it is desirable to inhibit the loss of the sub-atmospheric pressure in the second chamber 40 so that upon removal and reinsertion of the work holder 25 into the first chamber and the subsequent vacuum drawing operation it is unnecessary to also draw a vacuum in the second chamber. To this end, mounted on the shaft means 61 is check means 90 which is preferably of disc shape and composed of a flexible material such as stainless steel. In this manner, when the vent 18 is opened, and atmosphere or gas under pressure starts to enter the first chamber, the check valve 90, due to the differential pressure between the pressure in the second chamber 40 and the pressure in the first chamber 20, will close, sealing the opening 23 and preventing the loss of vacuum in that chamber valve 93 sustains vacuum in second chamber 40 whenever valve 90 is closed. In this connection, the position of the check valve 90 is shown in its sealed position in FIG. 1A.

After loading of the wafers into the work holder 25, commencing rotation of the work holder (no reciprocation) and pivoting the housing 40A into the horizontal position and forming a seal between the coacting and abutting wall means 21 and 41, a sub-atmospheric pressure is once again applied to the first chamber until the pressure in the first chamber is sufficiently low to overcome the resilience of the check means 90 and the vacuum or sub-atmospheric pressure existing in the second chamber 40. Thereafter, further pump down of the system takes place until the gate valve 17 is opened and then a high vacuum may be applied to the system, the work holder reciprocation commenced and ion implantation started.

As shown best in FIG. 2, it is preferably that the coaction between the abutting walls of the first and second chambers be such as to effect a good seal. To this end, and as is illustrated in the drawings, the casing 20A of the chamber 20 includes an enlarged opening 21A dimensioned to permit the passage of the work holder 25 into and out of the first chamber. Additionally, as illustrated, the walls 21 and 41 of the first and second chambers respectively are complimentarily stepped so as to coact and form, in conjunction with the seal 22, an air tight seal impervious to external atmospheric conditions.

The holder 25 contains a plurality of chucks thereon adapted to firmly hold the workpieces in their proper position relative to the ion beam 12, which chucks prevent the workpiecs 14 from being expelled from the work holder 25 during rotation and reciprocation thereof. The chucks, while being of any convenient structure, are preferably centrifugally acting chucks such as disclosed in Patent Application Ser. No. 631,013, filed on Nov. 12, 1975 and entitled "Centrifugal Support for Workpieces" and assigned to the assignee of the present invention, the pertinent parts of which application are hereby incorporated by reference.

As heretofore set forth, in order to effect both rotation and reciprocation of the work holder 25, drive means 60 are coupled through shaft means 61 to the work holder 25. To this end, the drive means 60 includes a box like frame 65 which is coupled to the flexible wall member 71 or bellows. The bellows is connected at its upper end 72 to an upper plate 40B of the housing 40A, and at the lower end 73 to the lower plate 40C of the housing 40A. Mounted on the top plate 40B of the housing 40A is a first drive motor 66 which through a flexible coupling 66A is connected to a rotatable lead screw 67 suitably mounted for rotation in a lower pedestal mount 67A coupled to the bottom plate 40C. A lead nut 68 is coupled to the frame 65 so that upon rotation of the lead screw the frame will be raised or lowered depending upon the direction of rotation of the lead screw.

The shaft means 61 includes a housing 62 which is coupled to the frame 65 and bolted or otherwise connected to a second motor 69. In the housing 62 there are a pair of coaxial shafts 63 and 64 respectively, the shaft 64 being coupled through the shaft 63 to the work holder 25, and rotatable within the outer shaft 63. The shaft means 61 is a conventional rotary vacuum shaft seal which may be purchased from Ferrofluidics Corp. in 144 Middlesex Turnpike, Burlington, Mass. 01803, Part No. SB-375-C-N-103. The shaft 64 is also coupled through a coupling 64A to the motor shaft 69A to effect such rotation to the shaft 64, while the outer shaft 63 is connected to the housing 62. In this manner, as the lead screw 67 rotates, the frame 65 moves up and down in a reciprocatory motion, permitting the work holder to reciprocate, and the motor 69 effects rotation of the shaft 64 causing the work holder to rotate. As may be seen, the connection of the bellows or flexible wall members 71 in conjunction with the frame 65 effectively creates a third chamber 70 which is sealed from the second chamber 40 and thus the first chamber 20. In this manner, the third chamber may be under atmospheric pressure.

In order to provide fluid communication between the first chamber 20 and the second chamber 40, the opening 23 in the wall 41 associated with the housing 40A is sufficiently large to enable reciprocation of the housing 62 associated with the shaft means 61, which also provides an opening for fluid communication between the chambers. In order to inhibit sub-atmospheric pressure leakage or pressurizing of the second chamber 40 upon the vent 18 being opened, and as heretofore explained, the check means 90 automatically closes the chamber 40 from fluid communication so that the housing 40A may be separated from the chamber 20. To this end, the check means 90 comprises a disc which is connected to the housing 62 associated with the shaft means 61. In one embodiment, the disc is composed of stainless steel approximately .090 inch thick and positioned so as to permit a clearance between its rear side and the wall 41 of approximately .030 inch. Positioned in a groove 91 in the wall 41 is an O-ring seal 92 which, when the apparatus is in operation and ion implantation is occurring is spaced from the rear side of the check means 90. (FIG. 2A) However, when the vent 18 is opened, just prior to withdrawal of the work holder 25, the sudden pressurization of the first chamber 20 and the difference of pressure between that in the chamber 40 and that in the chamber 20 causes a deflection of the disc 90 efecting a mating seal between the annular O-ring 92 and the rear side of disc 90 effectively sealing the second chamber 40. (FIG. 2B)

In the event that it is desired to release the pressure in the second chamber 40, for example if the machine is not going to be in operation for an extended period of time, a second vent 93 may be located on the housing 40A to permit repressurization of the second chamber 40 thereby equalizing the pressure and permitting the check valve 90 to once again return to its first or normal position such as shown in FIGS. 2 and 2A.

Thus the apparatus in the present invention permits an effective isolation of the chamber in which is housed the driving mechanism for the ion implantation or work holder apparatus permitting of faster pump down, and increasing the throughput of the machine.

Although the invention has been described with a certain degree of particularity, it is understood that the present disclosure has been made only by way of example and that numerous changes in the details of construction, the combination and arrangement of parts and the mode of operation may be made without departing from the spirit and the scope of the invention as hereinafter claimed.

What is claimed is:

1. Ion implantation apparatus comprising in combination: a disc shaped workpiece holder and drive means to effect both reciprocation and rotation of said holder, a first chamber in which said holder is mounted for reciprocation and rotation, and a second chamber housing said drive means, said first and second chambers being in fluid communication when said apparatus is in operation; means for decreasing the pressure below atmospheric in said first and second chamber at least during rotation and reciprocation of said holder and selectively operable vent means to increase the pressure in at least said first chamber when desired; means to withdraw said workpiece holder from said first chamber and check means to inhibit a pressure increase in said second chamber upon operation of said vent means to thereby maintain a sub-atmospheric pressure in said second chamber upon withdrawal of said workpiece holder.

2. Apparatus in accordance with claim 1 including a third chamber in said second chamber, said third chamber having a flexible wall and being sealed from the atmosphere in said second chamber, and means mounting said drive means in said third chamber to thereby isolate said drive means from the pressure in said second chamber.

3. Apparatus in accordance with claim 2 wherein said second chamber includes an upper and a lower wall portion, and said flexible wall of said third chamber comprises a bellows, and means for sealably connecting said bellows to said wall of said chamber.

4. Apparatus in accordance with claim 1 including coacting and abutting wall means intermediate said first and second chambers, means to seal said chambers at said wall means from atmospheric pressure outside said chambers; shaft means extending through said wall means connecting said drive means to said workpiece holder, said check means connected to said shaft means.

5. Apparatus in accordance with claim 4 wherein said shaft means includes coaxially mounted first and second shafts, said first shaft being reciprocatable by said drive means and said second shaft being both rotatable and reciprocatable and connected to said holder.

6. Apparatus in accordance with claim 5 including an aperture in said coacting and abutting wall means dimensioned to permit passage of said shaft means between said first and second chambers and to permit reciprocation of said shaft means.

7. Apparatus in accordance with claim 6 wherein said check means comprises a disc shaped member mounted on said first shaft, said disc movable between a first but open position permitting fluid communication between said first and second chambers and a second position inhibiting fluid communication between said chambers.

8. In ion implantation apparatus comprising; an ion source; a first chamber, means for coupling an ion beam from said ion source to said first chamber; a workpiece holder mounted for rotation and reciprocation in said first chamber in the path of said ion beam; a second chamber releasably coupled to said first chamber and means to effect relative displacement between said first and second chambers whereby, when said chambers are in a first position, they are in fluid communication one with the other and when in a second position they are separated one from the other; a bellows in said second chamber defining a third chamber, said bellows preventing fluid communication between said first mentioned chambers and said third chamber, and drive means in said third chamber coupled to said workpiece holder to effect said rotation and reciprocation of said workpiece holder; and means to effect sub-atmospheric pressure in said first and second chambers, and check means to seal said second chamber from said first chamber when said first and second chambers are in said second position.

9. In ion implantation apparatus in accordance with claim 8 wherein said drive means includes shaft means extending from said third chamber, through said second chamber and into said first chamber, and means defining an opening between said first and second chambers to permit passage of said shaft means for both reciprocation and rotation thereof.

10. In ion implantation apparatus in accordance with claim 8 wherein said check means comprises a disc mounted on said shaft means and dimensioned to cover said opening upon pressurization of said first chamber.

* * * * *